(12) United States Patent
Su et al.

(10) Patent No.: US 12,738,908 B2
(45) Date of Patent: Sep. 15, 2026

(54) POWER AMPLIFIER AND CONTROL METHOD

(71) Applicant: SMARTER MICROELECTRONICS (GUANG ZHOU) CO., LTD., Guangzhou (CN)

(72) Inventors: Qiang Su, Guangzhou (CN); Chifeng Liu, Guangzhou (CN); Cha Liu, Guangzhou (CN); Yongle Li, Guangzhou (CN)

(73) Assignee: SMARTER MICROELECTRONICS (GUANG ZHOU) CO., LTD., Guangzhou (CN)

(*) Notice: Subject to any disclaimer, the term of this patent is extended or adjusted under 35 U.S.C. 154(b) by 465 days.

(21) Appl. No.: 18/466,472

(22) Filed: Sep. 13, 2023

(65) Prior Publication Data

US 2023/0421123 A1 Dec. 28, 2023

Related U.S. Application Data

(63) Continuation of application No. PCT/CN2022/115313, filed on Aug. 26, 2022.

(30) Foreign Application Priority Data

Aug. 26, 2021 (CN) ......................... 202110985494.3

(51) Int. Cl.
*H03F 3/24* (2006.01)

(52) U.S. Cl.
CPC ....... *H03F 3/245* (2013.01); *H03F 2200/451* (2013.01)

(58) Field of Classification Search
None
See application file for complete search history.

(56) References Cited

U.S. PATENT DOCUMENTS 8,648,656 B2 * 2/2014 Nozaki ................ H03G 1/0029 330/311
2014/0049321 A1 * 2/2014 Gebeyehu ................ H03G 3/30 330/279

* cited by examiner

*Primary Examiner* — Andrea Lindgren Baltzell
*Assistant Examiner* — Malane Lieng
(74) *Attorney, Agent, or Firm* — Syncoda LLC; Feng Ma

(57) ABSTRACT

A power amplifier includes a current generating circuit, a first mirroring circuit, a power amplifying circuit and a stacked circuit, in which the current generating circuit is configured to output a first current according to a received first control voltage; the first mirroring circuit is configured to, according to the first current, minor the current and output a first bias current, the first bias current for being input into the power amplifying circuit; and the power amplifying circuit is configured to, according to a first radio frequency signal and the first bias current, output a second radio frequency signal with a power that meets a preset condition.

16 Claims, 4 Drawing Sheets

POWER AMPLIFIER AND CONTROL METHOD

CROSS-REFERENCE TO RELATED APPLICATIONS

This is a continuation of International Application No. PCT/CN2022/115313 filed on Aug. 26, 2022, which claims priority to Chinese Patent Application No. 202110985494.3 filed on Aug. 26, 2021. The disclosures of the above-referenced applications are hereby incorporated by reference in their entirety.

BACKGROUND

Generally, the output power of a power amplifier of the global system for mobile communication (GSM) is controlled by a control voltage (Vramp) provided by a baseband chip. The radio frequency index of the GSM power amplifier needs to meet the requirements of the 3rd generation partnership project (3GPP). According to the 3GPP protocol, the establishment process of power in time domain needs to meet the requirement of power vs. time (PVT) template.

SUMMARY

However, before the start of the rising edge of the Vramp, the Vramp has an initial value, which makes transistors operate in a saturation region with strong amplification ability. As a result, the power fails to meet the index requirements of the 3GPP on the PVT template, thereby leading to failure of the forward isolation index, that is, the power-time curve of the GSM power amplifier does not conform to the PVT template.

In view of this, embodiments of the disclosure provide a power amplifier and a control method to meet the requirement of the power vs. time template.

The disclosure relates to mobile communication technologies, in particular to a power amplifier and a control method.

In order to achieve the above purpose, the technical solution of the disclosure is realized as follows.

Embodiments of the disclosure provide a power amplifier, which includes a current generating circuit, a first mirroring circuit and a power amplifying circuit. The current generating circuit is configured to output a first current according to a received first control voltage.

The first minoring circuit is configured to, according to the first current, mirror the current and output a first bias current.

The power amplifying circuit has a stacked circuit unit, and is configured to output a second radio frequency signal with a power that meets a preset condition according to a first radio frequency signal and the first bias current which are respectively input into different stacked transistors.

In the above solution, the first bias current is positively correlated with the first control voltage.

In the above solution, the current generating circuit includes a first branch and a second branch; and the first control voltage is used to control a conductive state of the first branch.

When the first branch is conductive, the second branch outputs a first target current as the first current.

When the first branch is partially conductive, the second branch outputs a second target current as the first current.

When the first branch is turned off, the second branch outputs a third target current as the first current.

The third target current is greater than the second target current, and the second target current is greater than the first target current.

In the above embodiments, the first branch is conductive when the first control voltage is less than a first preset value, the first branch is turn off when the first control voltage is greater than a second preset value, and the first branch is partially conductive when the first control voltage is between the first preset value and the second preset value.

In the above embodiments, the current generating circuit further includes a first current source; and an output end of the first current source is connected to the first branch and the second branch.

In the above embodiments, the second branch includes a second current source.

When the first branch is conductive, the first current is equal to a current of the second current source.

When the first branch is turn off, the first current is equal to a sum of current values of the first current source and the second current source.

In the above embodiments, the first branch includes a fifth transistor, a seventh transistor and a first resistor.

A first end of the first resistor is used to connect with the first current source; a second end of the first resistor is connected to a source of the seventh transistor; a drain of the seventh transistor is connected to a drain of the fifth transistor and a gate of the fifth transistor; and a gate of the seventh transistor is used to receive the first control voltage.

In the above embodiments, the second branch includes a sixth transistor, an eighth transistor, a second resistor and the second current source.

A first end of the second resistor is used to connect a first current source; a second end of the second resistor is connected to a source of the eighth transistor; a drain of the eighth transistor is connected to a drain of the sixth transistor, a gate of the sixth transistor and an output end of the second current source; and the second current source provides a minimum operating current of the power amplifier.

In the above embodiments, a gate of the eighth transistor is used to obtain a second control voltage to change a change rate of the first current.

In the above embodiments, the first mirroring circuit includes a first transistor connected to the second branch.

The first transistor is used to, according to the first current output by the second branch circuit, minor the current, and output the first bias current.

In the above embodiments, the power amplifying circuit further includes a first input unit, a second input unit and a second minoring circuit.

The first input unit is configured to receive the first bias current and provide the first bias current for a first stacked transistor of the stacked circuit unit.

The second input unit is configured to receive the first radio frequency signal.

The second minoring circuit is configured to, according to the bias current of the power amplifier, minor the current, output a second bias current, and provide the second bias current for a second stacked transistor of the stacked circuit unit, in which the bias current is generated based on the first control voltage.

The stacked circuit unit is configured to output a second radio frequency signal with a power that meets a preset condition, according to the first radio frequency signal, the second bias current and the first bias current.

In the above embodiments, the preset condition includes the power amplifier meeting a preset forward isolation index.

Embodiments of the disclosure further provide a control method, which includes the following operations.

A current generating circuit outputs a first current according to a received first control voltage.

A first mirroring circuit performs current mirroring according to the first current and outputs a first bias current, in which the first bias current is used to be input into a power amplifying circuit.

The power amplifying circuit outputs a second radio frequency signal with a power that meets a preset condition, according to a first radio frequency signal and the first bias current.

In the above embodiments, the current generating circuit includes a first branch and a second branch; and outputting the first current according to the received first control voltage includes the following operations.

When the first branch is conductive, the second branch, according to the first control voltage, outputs a first target current as the first current.

When the first branch is partially conductive, the second branch, according to the first control voltage, outputs a second target current as the first current.

When the first branch is turned off, the second branch outputs a third target current as the first current according to the first control voltage.

The third target current is greater than the second target current, and the second target current is greater than the first target current.

In the above embodiments, the first mirroring circuit includes: a first transistor connected to the second branch; and performing current mirroring according to the first current and outputting the first bias current by the first mirroring circuit includes the following operation.

The first transistor performs current mirroring according to the first current output by the second branch and outputs the first bias current.

In the above embodiments, the power amplifying circuit includes: a first input unit, a second input unit, a second mirroring circuit and a stacked circuit unit; and outputting a second radio frequency signal with a power that meets a preset condition according to a first radio frequency signal and the first bias current by the power amplifying circuit includes the following operations.

The first input unit receives the first bias current and provides the first bias current for a first stacked transistor of the stacked circuit unit.

The second input unit receives the first radio frequency signal.

The second minoring circuit performs current mirroring according to the bias current of the power amplifier, outputs a second bias current, and provides the second bias current for a second stacked transistor of the stacked circuit unit.

The stacked circuit unit outputs the second radio frequency signal with a power that meets a preset condition, according to the first radio frequency signal, the second bias current and the first bias current.

In the above embodiments, the preset condition includes: the power amplifier meeting a preset forward isolation index.

The power amplifier and the control method are provided by the embodiments of the disclosure. The power amplifier includes a current generating circuit, a first mirroring circuit and a power amplifying circuit; in which the current generating circuit is configured to output a first current according to a received first control voltage; the first mirroring circuit is configured to mirror current according to the first current and output a first bias current; the first bias current is used to be input into the power amplifying circuit; the power amplifying circuit is configured to output a second radio frequency signal with a power that meets the preset condition, according to the first radio frequency signal and the first bias current. As such, the first bias current is obtained according to the first control voltage, and thus, the second radio frequency signal with a power that meets the preset condition (i.e., the requirement of the forward isolation index) is output based on the first bias current and the first radio frequency signal, so that the power amplifier meets the requirement of the forward isolation index, and the power vs. time curve of the power amplifier meets the requirement of the power vs. time template.

BRIEF DESCRIPTION OF THE DRAWINGS

In the accompanying drawings (which are not necessarily drawn to scale), similar reference numerals indicate similar parts in different views. The various embodiments discussed herein are generally shown by the drawings by way of example, rather than limitation.

DETAILED DESCRIPTION

The disclosure is described in detail below with reference to the accompanying drawings and the embodiments. It can be understood that the specific embodiments described herein are only for explaining the disclosure, but not to limit the disclosure.

Figure 1:
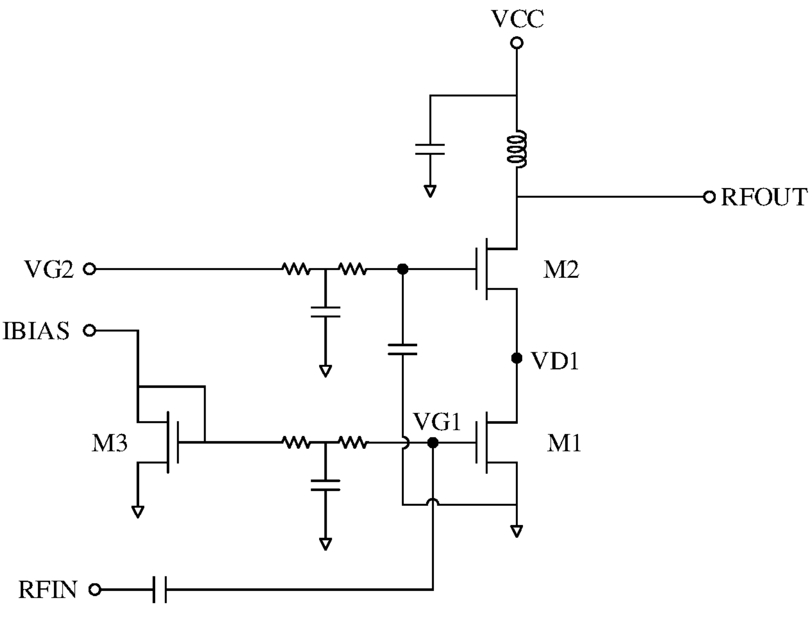
FIG. 1 is a structural schematic diagram of a power amplifier based on a cascode structure in some implementations.

FIG. 1 is a structural schematic diagram of a power amplifier based on a cascode structure in some implementations. As shown in FIG. 1, in order to meet the index requirements of the saturation output power (Psat) of the power amplifier (PA), the gate bias voltage (VG2) of M2 needs to be kept at a high value all the time, so that transistor M1 and transistor M2 operate in the saturation regions.

Figure 2:
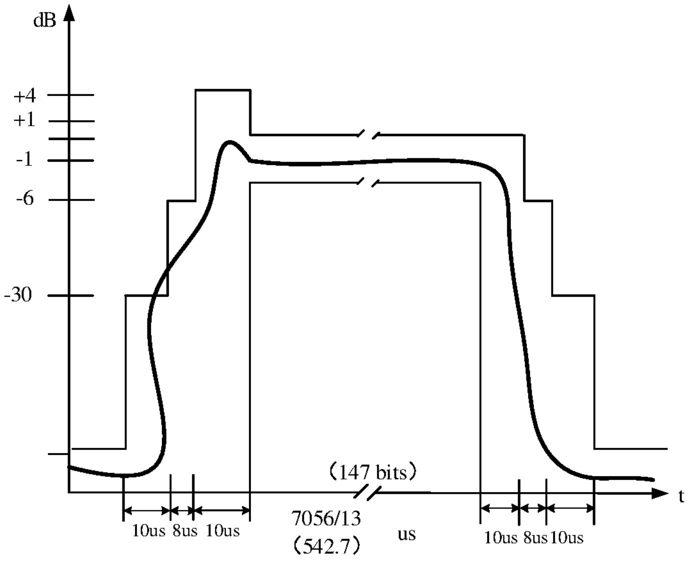
FIG. 2 is a schematic diagram of a power vs. time template curve corresponding to an abnormal forward isolation index in some implementations.

In a GSM mode, the Vramp is not equal to 0 before the start of the rising edge of the Vramp, and the Vramp has an initial value, for example, about 0.16 V. This causes that a bias current (IBIAS in FIG. 1) is input into the drain of transistor M3. A current Ic is generated at M1 because the IBIAS is not equal to 0. Because VG2 is always a relatively great fixed value, when the Ic is not 0, the relatively great VG2 raises the source voltage VD1 of M2, resulting in VD1>VG1−VTH1 (VTH1 is the turn-on voltage of the transistor M1), thereby the transistor M1 operating in its saturation region and having a stronger amplification ability. However, according to the index requirements of PVT in the 3GPP protocol, before the rising edge of the Vramp, the forward isolation of the PA does not need too much power, which is generally below −30 dB. Therefore, the power amplifier with such structure is easy to cause the power to reach the power vs. time template, which leads failure of the forward isolation index, as shown in FIG. 2.

Figure 3:
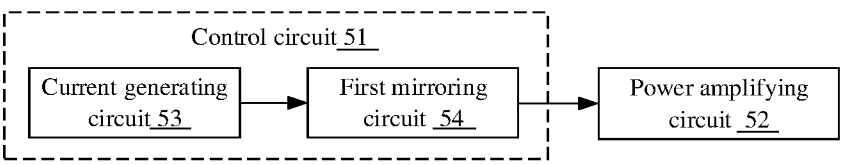
FIG. 3 is a schematic structural diagram of a power amplifier provided by an embodiment of the disclosure.

Based on this, embodiments of the disclosure provide a power amplifier as shown in FIG. 3, which includes a control circuit 51 and a power amplifying circuit 52. The control circuit 51 includes a current generating circuit 53 and a first mirroring circuit 54. The control circuit provides a first bias current for the power amplifying circuit. Specifically, the current generating circuit is used to output a first current according to a received first control voltage; the first mirroring circuit is used to mirror the current according to the first current and output the first bias current; and the power amplifying circuit is used to output a second radio frequency signal with a power that meets a preset condition according to a first radio frequency signal and the first bias current. The first current varies with the first control voltage.

In an embodiment, the first mirroring circuit is specifically used to output a first bias current that is the same as the first current accordance to the first current. In other embodiments, the first bias current proportional to the first current may be output, for example, the first bias current is 2 times, 3 times, or the like of the first current.

In practical applications, the first control voltage is the control voltage provided by a baseband chip to the power amplifier to control the output power of the power amplifier.

In an embodiment, the power amplifier may be a GSM power amplifier. The preset condition, which is met by the varying of the power output of the power amplifier over time, can be a power vs. time template (PVT). That is, the forward isolation of the power amplifier is required to be below −30 dB within 10 μs before the rising edge of the control voltage.

In an embodiment, the first bias current is positively correlated with the first control voltage, in which the positive correlation may be a linear relationship or other positive correlation relationships, such as a polynomial relationship or an exponential relationship.

In an embodiment, the current generating circuit 53 includes a first branch and a second branch. The first control voltage is used to control the conductive state of the first branch.

When the first branch is conductive, the second branch outputs a first target current as the first current. When the first branch is partially conductive, the second branch outputs a second target current as the first current. When the first branch is turned off, the second branch outputs a third target current as the first current. The third target current is greater than the second target current, and the second target current is greater than the first target current.

In an embodiment, the current generating circuit 53 further includes a first current source, and the output end of the first current source is connected to the first branch and the second branch.

In an embodiment, the second branch includes a second current source that provides the minimum operating current of the power amplifier. When the first branch is conductive, the first current is equal to the current of the second current source. When the first branch is turned off, the first current is equal to the sum of currents of the first current source and the second current source.

Specifically, when the first branch is conductive based on the first control voltage, the second branch is in a turned-off state, all the current of the first current source flows to the ground through the first branch, and the first target current output by the second branch is only the minimum operating current of the power amplifier provided by the second current source. The first target current is taken as the first current at this time. That is, the first current is equal to the current of the second current source.

When the first branch is partially conductive, the current of the first current source flows to the ground through both of the first branch and the second branch, the second target current output by the second branch is the sum of part of the current of the first current source and the current of the second current source. The second target current is taken as the first current at this time.

When the first branch is turned off, the second branch is in a conductive state; all the current of the first current source flows through the second branch, the third target current output by the second branch is the sum of the current of the first current source and the current of the second current source. The third target current is taken as the first current at this time, that is, the first current is equal to the sum of the currents of the first current source and the second current source.

The minimum operating current of the power amplifier is the minimum normal operating current ensuring that the radio frequency index of the power amplifier meets the requirement of the power vs. time template meanwhile avoiding an oscillation problem of the power amplifier.

In an embodiment, the first mirroring circuit 54 includes a first transistor connected to the second branch. The first transistor is used to mirror the current according to the first current output by the second branch, and output the first bias current.

The first transistor is specifically used to output a first bias current that is the same as the first current accordance to the first current.

Current minoring refers to two currents that are the same or in which one current is n times the other current (n is a positive integer greater than 1). Here, it refers to obtaining a first bias current that is the same as the first current.

The power amplifier provided by the embodiments of the disclosure outputs the first current according to the received first control voltage, minors the current according to the first current and outputs the first bias current to the power amplifying circuit 52. According to the first radio frequency signal and the first bias current, the power amplifying circuit 52 makes the transistors of the power amplifying circuit 52 operate in a linear region or even a deep linear region, such that the power of the second radio frequency signal output by the power amplifying circuit 52 meets the preset forward isolation index, thereby meeting the requirement of the power vs. time template.

Figure 4:
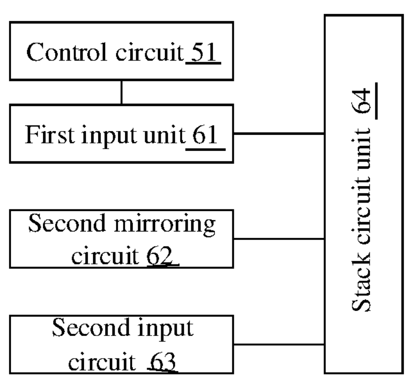
FIG. 4 is a schematic structural diagram of another power amplifier provided by an embodiment of the disclosure.

FIG. 4 is a schematic structural diagram of another power amplifier provided by an embodiment of the disclosure. The power amplifier includes a power amplifying circuit and a control circuit 51. The power amplifying circuit includes a first input unit 61, a second input unit 63, a second minoring circuit 62 and a stacked circuit unit 64.

The first input unit 61 is used to receive a first bias current.

The second input unit 63 is used to receive a first radio frequency signal.

The second minoring circuit 62 is used to minor the current according to the bias current of the power amplifier and output a second bias current. The second bias current is the current flowing through the stacked circuit unit. The bias current is generated based on a first control voltage.

The stacked circuit unit 64 is used to output a second radio frequency signal with a power that meets a preset condition, according to the first radio frequency signal, the second bias current and the first bias current.

The control circuit 51 is a control circuit of any of the above embodiments and is not repeated here.

In an embodiment, a first branch of the current generating circuit 53 includes a fifth transistor, a seventh transistor and a first resistor; in which the first end of the first resistor is connected to a first current source; the second end of the first resistor is connected to the source of the seventh transistor; the drain of the seventh transistor is connected to the drain of the fifth transistor and the gate of the fifth transistor; and the gate of the seventh transistor is used to receive the first control voltage.

The seventh transistor may be a P-type transistor, and the fifth transistor may be an N-type transistor.

In an embodiment, the first control voltage is used to control the conductive state of the first branch. The first branch is conductive when the first control voltage is less than a first preset value, the first branch is turned off when the first control voltage is greater than a second preset value, and the first branch is partially conductive when the first control voltage is between the first preset value and the second preset value.

In an embodiment, the first preset value may be 0V and the second preset value may be VTH7 (VTH7 is the turn-on voltage of the seventh transistor M7).

In an embodiment, the second branch of the current generating circuit 53 includes a sixth transistor, an eighth transistor, a second resistor and a second current source.

The first end of the second resistor is connected to the first current source; the second end of the second resistor is connected to the source of the eighth transistor; the drain of the eighth transistor is connected to the drain of the sixth transistor, the gate of the sixth transistor and the output end of the second current source; and the gate of the sixth transistor is connected to the second current source.

The eighth transistor may be a P-type transistor, and the sixth transistor may be an N-type transistor.

In an embodiment, the gate of the eighth transistor is used to obtain a second control voltage to change the change rate of the first current output by the second branch.

In an embodiment, the second mirroring circuit 62 includes a second transistor and a fourth transistor. The second transistor and the fourth transistor are a current mirror combination. The second mirroring circuit 62 is used to minor current by the current mirror combination of the second transistor and the fourth transistor according to the bias current of the power amplifier, and output the second bias current corresponding to the bias current of the power amplifier. The second bias current is the current flowing through the stacked circuit unit 64. The bias current of the power amplifier varies positively with the first control voltage. That is, when the value of the first control voltage is zero, the bias current of the power amplifier is the minimum operating current of the power amplifier; when the first control voltage increases, the bias current of the power amplifier also increases with the increase of the first control voltage until the maximum value, i.e. the sum of the currents of the first current source and the minimum operating current of the power amplifier.

In an embodiment, the second mirroring circuit 62 is specifically used to output a second bias current that is n times the bias current of the power amplifier accordance to the bias current of the power amplifier.

Current mirroring refers to two currents which are the same or in which one current is n times as the other current (n is a positive integer greater than 1). Here, it refers to the obtained second bias current that is n times the bias current of the power amplifier.

In an embodiment, the stacked circuit unit 64 includes the second transistor and a third transistor. The drain of the second transistor is connected to the source of the third transistor.

The stacked circuit unit 64 is used to output the second radio frequency signal with a power that meets the preset condition, according to the first radio frequency signal received by the second input unit 63, the second bias current output by the second mirroring circuit 62 and the first bias current received by the first input unit 61.

Specifically, the stacked circuit unit 64 determines a second input voltage according to the relationship between the first bias current and the second input voltage. The relationship between the first bias current and the second input voltage may be a linear relationship or other positively correlation relationship, such as a polynomial relationship or an exponential relationship. The second input voltage is the gate bias voltage of the third transistor.

The stacked circuit unit 64 determines a third voltage according to the relationship between the second input voltage and the third voltage. The relationship between the second input voltage and the third voltage is positive correlation, that is, the third voltage decreases with the decrease of the second input voltage. The third voltage is the source voltage of the third transistor, and also the drain voltage of the second transistor.

In an embodiment, the preset condition includes: the power amplifier meeting a preset forward isolation index.

That the power amplifier meeting the preset forward isolation index, specifically includes that the forward isolation of the power amplifier requires to be below −30 dB within 10 μs before the rising edge of the control voltage, i.e. the first control voltage.

The preset conditions may also include: the saturated output power of the amplifier reaching an index requirement.

In practical applications, the stacked circuit unit 64 used to output the second radio frequency signal with a power that meets the preset condition, according to the first radio frequency signal, the second bias current and the first bias current specifically includes the following two cases.

In the first case, before the start of the rising edge of the first control voltage, the first control voltage of the control circuit 51 is small, the first bias current output by the control circuit 51 is also small, and the second input voltage obtained based on the positive correlation relationship between the first bias current and the second input voltage is also small. At this time, the third voltage decreases as the second input voltage decreases, when the third voltage value is less than a preset threshold value, the second transistor and the third transistor of the stacked circuit unit 64 operate in a linear region or even a deep linear region, and the power of the second radio frequency signal meets the preset forward isolation index, thereby meeting the requirement of the power vs. time template.

In the second case, as the first control voltage increases, the first bias current output by the control circuit 51 also increases, and the second input voltage obtained based on the positive correlation relationship between the first bias current and the second input voltage also increases. At this time, the third voltage increases as the second input voltage increases, when the third voltage is greater than the preset threshold value, the second transistor and the third transistor of the stacked circuit unit 64 operate in a saturation region, and the saturation output power of the second radio frequency signal meets the index requirement.

In the embodiments of the disclosure, on the one hand, the second input voltage is also small before the first control voltage, i.e., the control voltage starts to rise, so that the transistors of the stacked circuit unit 64 operate in the linear region or even deep linear region, and the power amplifier meets the preset forward isolation index, thereby meeting the requirement of the power vs. time template. On the other hand, as the control voltage increases, the second input voltage also increases, so that the transistors of the stacked circuit unit 64 operate in the saturation region, and the saturation output power meets the index requirement. The power amplifier of the embodiments of the disclosure improves the forward isolation index of the power amplifier by controlling the voltage, so as to meet the requirement of the power vs. time template.

Figure 5:
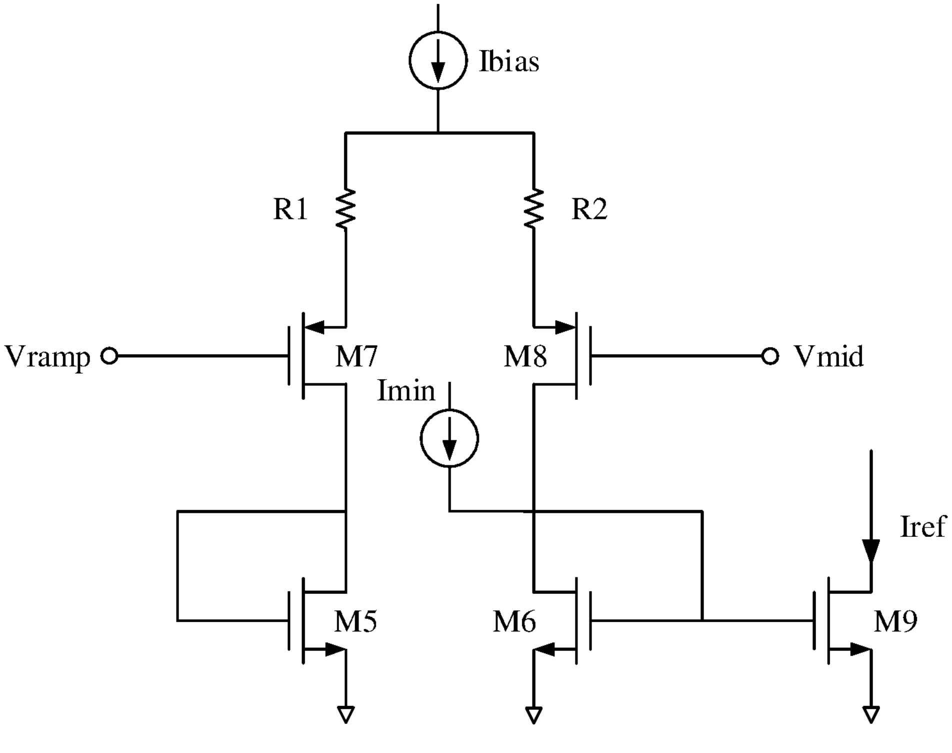
FIG. 5 is a schematic structural diagram of a control circuit provided by an embodiment of the disclosure.

FIG. 5 is a structural schematic diagram of a control circuit provided by an embodiment of the disclosure, and is a specific application example of the control circuit of the circuit shown in FIG. 3.

A control circuit 51 includes a current generating circuit 53 and a first mirroring circuit 54. As shown in FIG. 5, the current generating circuit 53 includes a first current source (Ibias), a first branch and a second branch. The first branch may include an NMOS transistor M5, a PMOS transistor M7, a first resistor R1. The second branch may include an NMOS transistor M6, a PMOS transistor M8, a second resistor R2, and a second current source, in which the second current source provides the minimum operating current (Imin) of the power amplifier. In the first branch, the first end of the first resistor R1 is connected to the first current source (Ibias), the second end of the first resistor R1 is connected to the source of the PMOS transistor M7, the drain of the PMOS transistor M7 is connected to the drain of the NMOS transistor M5 and the gate of the NMOS transistor M5, and the source of the NMOS transistor M5 is grounded. In the second branch, the first end of the second resistor R2 is connected to the first current source (Ibias), the second end of the second resistor R2 is connected to the source of the PMOS transistor M8, the drain of the PMOS transistor M8 is connected to the drain of the NMOS transistor M6, the gate of the NMOS transistor M6 and the second current source, the source of the NMOS transistor M6 is grounded, and the gate of the NMOS transistor M6 is connected to the second current source. The first mirroring circuit 54 may include the NMOS transistor M6 and an NMOS transistor M9. The NMOS transistor M6 and the NMOS transistor M9 constitute a current minor, and the sizes of the transistors are the same.

The gate of the PMOS transistor M7 is connected to a first control voltage Vramp. The gate of the PMOS transistor M8 is connected to a second control voltage Vmid. The Imin is the minimum normal operating current ensuring the radio frequency indexes of the power amplifier meeting the requirement of the power vs. time template meanwhile avoiding the oscillation problem of the power amplifier. The Vmid is the minimum operating voltage ensuring the power amplifier meeting a preset forward isolation index.

The operating principle of the control circuit shown in FIG. 5 is as follows.

The value of the current I_M7 flowing through the PMOS transistor M7 is determined according to the Vramp, the value of the current I_M8 flowing through the PMOS transistor M8 is determined according to I_M7, and the value of the first current I_M6 flowing through the NMOS transistor M6 is determined according to I_M8 and the Imin. For I_M6 performs current mirroring to obtain the first bias current Iref flowing through the NMOS transistor M9. The Iref is used to be input into the power amplifying circuit so that the output power of a second radio frequency signal of the power amplifying circuit meets a preset condition.

Specifically, when Vramp=0V, M7 is turned on, M8 is turned off, the Ibias with a fixed value all passes through M7 to ground, and the first current I_M6 flowing through M6 is only the Imin. Since M6 and M9 constitute the current minor and the sizes the transistors are the same, Iref=Imin. With the increase of the Vramp, the gate source voltage of M7 gradually increases and the gate source voltage of M8 gradually decreases, and thus the proportion of the Ibias flowing into the drain of M8 is increasing until M7 is turned off, and all the Ibias flows into the drain of M8, so that the Iref gradually increases with the increase of the Vramp until reaches the maximum value of Ibias+Imin.

Figures 6, 7:
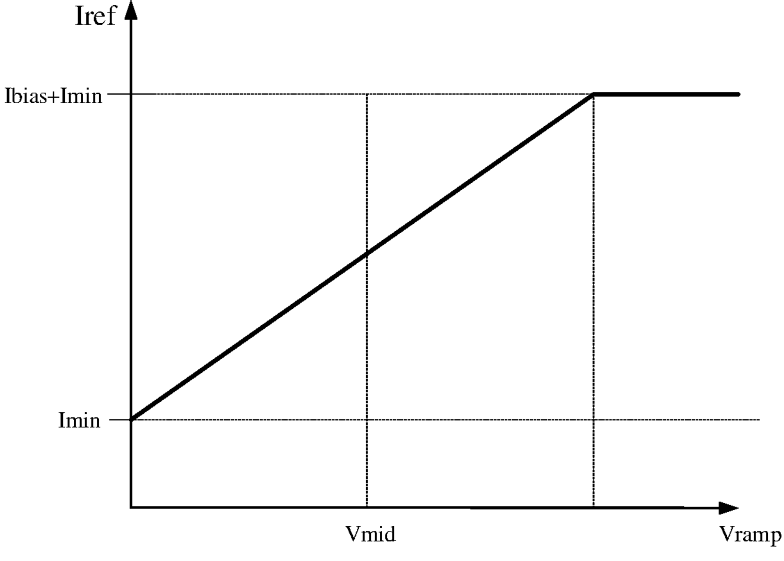
FIG. 6 shows a curve of current Iref changing with voltage Vramp provided by an embodiment of the disclosure.
FIG. 7 is a schematic diagram of the internal structure of a power amplifier provided by an embodiment of the disclosure.

The curve of the Iref varing with the Vramp is shown in FIG. 6. The Iref varies positively with the Vramp, that is, when Vramp=0V, the Iref takes the minimum value Imin; when Vramp increases, the Iref also increases with Vramp until the maximum value of Ibias+Imin.

In an embodiment, the NMOS transistor M9 is specifically used to output a first bias current Iref that is the same as I_M6 according to the value of I_M6 output by the second branch.

FIG. 7 is a schematic diagram of an internal component structure of a power amplifier provided by an embodiment of the disclosure, and is a specific application example of the circuit shown in FIG. 4.

As shown in FIG. 7, a power amplifier includes a power amplifying circuit, a control circuit 91 and a control circuit 92. The power amplifying circuit may include a transistor M1, a transistor M2 and a transistor M3. The transistor M3 and the transistor M1 constitute a current mirroring combination.

The operating principle of the power amplifier shown in FIG. 7 is as follows.

The control circuit 91 generates a first bias current according to a first control voltage and converts the first bias current into a first bias voltage VG2 (i.e., a second input voltage), and the control circuit 92 generates the bias current IBIAS of the power amplifier according to the first control voltage. The power amplifier determines the drain voltage VD1 of M1 according to the value of VG2, thereby controlling the operating state of the power amplifier. The relationship between the first bias current and the voltage VG2 may be a linear relationship or other positive correlation relationships, such as a polynomial relationship or an exponential relationship. The relationship between the voltage VG2 and the voltage VD1 is positively correlation, that is, VD1 decreases with the decrease of VG2. The control circuit 91 and the control circuit 92 are control circuits with the same structure, and the first bias currents output by them may be the same or different. The IBIAS varies positively with Vramp, that is, when the value of the Vramp is zero, the IBIAS takes the minimum operating current of the power amplifier; when the Vramp increases, the IBIAS also increases with the increase of the Vramp until reaches the maximum value, i.e., the sum of currents of the current source and the minimum operating current of the power amplifier.

Specifically, in the process of the Vramp changes from small to large, the operating process of the power amplifier includes the following two stages.

In the first stage, before the start of the rising edge of the Vramp, when the control voltage of the control circuit 91 is small, the first bias current output by the control circuit 91 is also small, and VG2 obtained based on the positive correlation relationship between the first bias current and VG2 is also small. At this time, the control voltage input into the control circuit 92 is small, and the first bias current output by the control circuit 92, i.e., the bias current of the power amplifier (IBIAS), is also small. At this time, VD1 decreases with the decrease of VG2. When VD1<VG1−VTH1 (VTH1 is the turn-on voltage of the transistor M1), the transistor M1 operates in the linear region or even deep linear region, and the amplification ability of M1 is very weak or even close to 0. The second radio frequency signal RF OUT output by the power amplifier meets a preset forward isolation index and the requirement of a power vs. time template.

In the second stage, as the Vramp increases, the first bias current output by the control circuit 91 also increases, and VG2 obtained based on the positive correlation relationship between the first bias current and VG2 also increases. The first bias current output by the control circuit 92 i.e. the bias current of the power amplifier (IBIAS) also increases with the increase of the Vramp. At this time, VD1 rises as VG2 rises. When VD1>VG1−VTH1, the transistors M1 and M2 of the power amplifier operate in the saturation region, and the saturation output power of the output second radio frequency signal RF OUT meets the index requirement.

In the embodiments of the disclosure, on the one hand, VG2 is small before the control voltage starts to rise, so that the transistors of the power amplifier operate in the linear region or even deep linear region, and the power amplifier meets the preset forward isolation index, thereby meeting the requirement of the power vs. time template. On the other hand, as the control voltage increases, VG2 also increases, so that the transistors of the power amplifier operate in the saturation region, and the saturation output power meets the index requirement. According to the disclosure, VG2 changes positively with the control voltage, the forward isolation index of the power amplifier is improved by controlling VG2 with the control voltage, so as to meet the requirement of the power vs. time template.

Here, VG2 changing positively with the control voltage means that the relationship between VG2 and the control voltage is a linear relationship or other positively correlated relationships, such as a polynomial relationship or an exponential relationship. Therefore, the slope of a curve of VG2 vs. the control voltage may have different values according to the requirements, so as to meet different application requirements.

The control circuit 91 and the control circuit 92 of the disclosure can be applied not only to a power amplifying circuit with a cascode structure, but also to a stacked circuit with two transistors or to a stacked circuit with more transistors.

Figure 8:
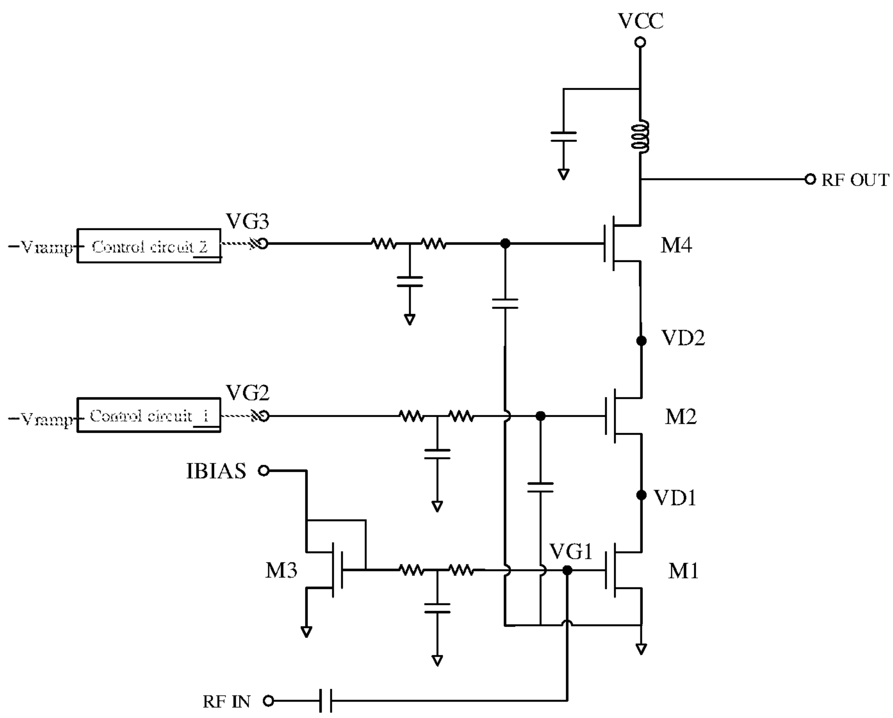
FIG. 8 is a schematic structural diagram of a power amplifier based on a stack structure provided by an embodiment of the disclosure.

FIG. 8 is a schematic diagram of an internal component structure of a power amplifier based on a stack structure provided by an embodiment of the disclosure. As shown in FIG. 8, similar to a cascode structure, in this embodiment, the power amplifier having a stack structure with three transistors also can control VG2, the gate bias voltage (VG3) of the transistor M4 and the bias current (IBIAS) of the power amplifier by the Vramp, and further control the operating state of the power amplifier.

In this embodiment, the power amplifier includes a control circuit and a power amplifying circuit. The control circuit includes a control circuit 1 and a control circuit 2. The power amplifying circuit includes a transistor M1, a transistor M2, a transistor M3 and a transistor M4. The transistor M3 and the transistor M4 are a current minor combination.

Specifically, in the process of the Vramp varying from small to large, the operating process of the power amplifier includes the following two stages.

In the first stage, before the start of the rising edge of the Vramp, when the control voltage of the control circuit is small, the first bias current output by the control circuit is also small, and VG2 and VG3 obtained based on the positive correlation relationship between the first bias current and VG2 and VG3 are also small. At this time, the value of the IBIAS obtained based on the positive correlation relationship between the IBIAS and the Vramp is also small. At this time, VD1 decreases with the decrease of VG2, and VD2 decreases with the decrease of VG3. When VD1<VG1−VTH1 (VTH1 is the turn-on voltage of the transistor M1) and VD2<VG2−VTH2 (VTH2 is the turn-on voltage of the transistor M2), the transistors M1 and M2 operate in the linear region or even deep linear region, and the amplification abilities of M1 and M2 are very weak or even close to 0. The decrease of the output power of the power amplifier meets a preset forward isolation index and meets the requirement of a power vs. time template.

In the second case, as the Vramp increases, the first bias current output by the control circuit also increases, and VG2 and VG3 obtained based on the positive correlation relationship between the first bias current and VG2 and VG3 also increase. At this time, the value of the IBIAS obtained based on the positive correlation relationship between the IBIAS and the Vramp is also large. At this time, VD1 rises as VG2 rises, and VD2 rises as VG3 rises. When VD1>VG1−VTH1 and VD2>VG2−VTH2, the transistors M1, M2 and M4 of the power amplifier operate in the saturation region, and the saturation output power meets the index requirement.

In the embodiments of the disclosure, on the one hand, VG2 and VG3 are small before the control voltage starts to rise, so that the transistors of the power amplifier operate in the linear region or even their deep linear region, and the power amplifier meets the preset forward isolation index, thereby meeting the requirement of the power vs. time template. On the other hand, as the control voltage increases, VG2 and VG3 also increase, so that the transistors of the power amplifier operate in the saturation region, and the saturation output power meets the index requirement. According to the disclosure, VG2 and VG3 change based on the positive correlation with the control voltage, by, the forward isolation index of the power amplifier is improved by controlling VG2 and VG3 with the control voltage, so as to meet the requirement of the power vs. time template.

Here, VG2 and VG3 changing based on the positive correlation with the control voltage means that the relationship between VG2 and the control voltage is a linear relationship or other positively correlated relationships, such as a polynomial relationship or an exponential relationship, and the relationship between VG3 and the control voltage is a linear relationship or other positively correlated relationships, such as a polynomial relationship or an exponential relationship. Therefore, the respective slopes of the curves of VG2 and VG3 changing with the control voltage may have different values according to the requirements, so as to meet different application requirements.

Figure 9:
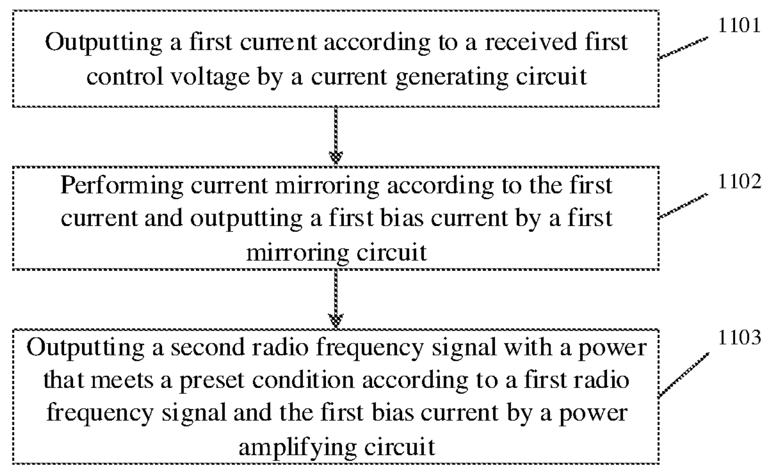
FIG. 9 is a schematic flowchart of a control method provided by an embodiment of the disclosure.

Based on the above embodiments, embodiments of the disclosure also provide a control method. As shown in FIG. 9, the method is applied to any of the above power amplifiers, and includes the following operations.

At S1101, a current generating circuit outputs a first current according to a received first control voltage.

At S1102, a first mirroring circuit performs current minoring according to the first current and outputs a first bias current.

At S1103, a power amplifying circuit outputs a second radio frequency signal with a power that meets a preset condition, according to a first radio frequency signal and the first bias current.

The first mirroring circuit outputs the first bias current that is the same as the first current according to the first current.

Current minoring refers to two currents that are the same or in which one current is n times as the other current (n is a positive integer greater than 1). Here, it refers to an obtained first bias current that is the same as the first current.

In an embodiment, the first control voltage is a control voltage provided by a baseband chip to the power amplifier to control the output power of the power amplifier.

In an embodiment, the power amplifier may be a GSM power amplifier. The preset condition, which is met by the change of the power output of the power amplifier over time, is a PVT template, that is, the forward isolation of the GSM power amplifier needs to be below −30 dB within 10 μs before the rising edge of the control voltage.

In an embodiment, the current generating circuit includes a first branch and a second branch, and outputting the first current according to the received first control voltage includes the following operations.

When the first branch is conductive, the second branch outputs a first target current as the first current according to the first control voltage.

When the first branch is partially conductive, the second branch outputs a second target current as the first current according to the first control voltage.

When the first branch is turned off, the second branch outputs a third target current as the first current according to the first control voltage.

The third target current is greater than the second target current, and the second target current is greater than the first target current.

Specifically, when the first branch is conductive, the second branch is in a turned off state based on the first control voltage. At this time, all the current of a current source flows to the ground through the first branch, and the first target current output by the second branch is only the minimum operating current of the power amplifier. The first target current is taken as the first current at this time.

When the first branch is partially conductive, the second branch is in a partially conductive state based on the first control voltage. At this time, the current of the current source flows to the ground through both of the first branch and the second branch, the second target current output by the second branch is the sum of part of the current of the current source and the minimum operating current of the power amplifier. The second target current is taken as the first current at this time.

When the first branch is turned off, the second branch is in a conductive state base on the first control voltage. At this time, all the current of the current source flows through the second branch, the third target current output by the second branch is the sum of the current of the current source and the minimum operating current of the power amplifier. The third target current is taken as the first current at this time.

The minimum operating current of the power amplifier is the minimum normal operating current ensuring the radio frequency indexes of the power amplifier meeting the requirement of the power vs. time template meanwhile avoiding an oscillation problem of the power amplifier.

In an embodiment, the first mirroring circuit includes a first transistor connected to the second branch. The first mirroring circuit performing current mirroring according to the first current and outputting the first bias current includes the following operation.

The first transistor performs current mirroring according to the first current output by the second branch and outputs the first bias current.

Specifically, the first transistor outputs a first bias current that is the same as the first current accordance to the first current.

Current mirroring refers to two currents that are the same or in which one current is n times as the other current (n is a positive integer greater than 1). Here, it refers to an obtained first bias current that is the same as the first current.

In an embodiment, the power amplifying circuit includes a first input unit, a second input unit, a second mirroring circuit and a stacked circuit unit.

The power amplifying circuit outputting the second radio frequency signal according to the first radio frequency signal and the first bias current includes the following operations.

The first input unit receives the first bias current.

The second input unit receives the first radio frequency signal.

The second minoring circuit performs current mirroring according to the bias current of the power amplifying circuit and outputs a second bias current, in which the second bias current is the current flowing through the stacked circuit unit. The bias current of the power amplifier varies positively correlated with the first control voltage, that is, when the value of the first control voltage is zero, the bias current of the power amplifier is the minimum operating current of the power amplifier; when the first control voltage increases, the bias current of the power amplifier also increases with the increase of the first control voltage until reaches the maximum value, i.e. the sum of the current of the current source and the minimum operating current of the power amplifier.

In an embodiment, the second mirroring circuit specifically outputs a second bias current that is n times the bias current of the power amplifier according to the bias current of the power amplifier.

Current minoring refers to two currents that are the same or in which one current is n times as the other current (n is a positive integer greater than 1). Here, it refers to the obtained second bias current that is n times the bias current of the power amplifier.

The stacked circuit unit outputs the second radio frequency signal with a power that meets the preset condition, according to the first radio frequency signal, the second bias current and the first bias current.

In an embodiment, the preset condition includes: the power amplifier meeting a preset forward isolation index.

In an embodiment, the transistors may be a metal-oxide semiconductor field-effect transistor (MOSFET), a bipolar junction transistor (BJT) and/or a heterojunction bipolar transistor (HBT), which is not limited by the embodiments of the disclosure.

The above are only preferred embodiments of the disclosure, and are not intended to limit the protection scope of the disclosure. Any modification, equivalent replacement and improvement made within the spirit and principle of the disclosure are included in the protection scope of the disclosure.

A power amplifier provided by the disclosure, can obtain a first bias current according to a first control voltage, thereby outputting a second radio frequency signal with a power that meets a preset condition (i.e., the requirement of a forward isolation index) based on the first bias current and a first radio frequency signal, such that the power amplifier meets the requirement of the forward isolation index, and the power vs. time curve of the power amplifier meets the requirement of a power vs. time template.

The invention claimed is:

1. A power amplifier, comprising: a current generating circuit, a first mirroring circuit and a power amplifying circuit, wherein the current generating circuit is configured to output a first current according to a received first control voltage;

the first mirroring circuit is configured to, according to the first current, mirror the current, and output a first bias current; and the power amplifying circuit has a stacked circuit unit, and is configured to output a second radio frequency signal with a power that meets a preset condition, according to a first radio frequency signal and the first bias current which are respectively input into different stacked transistors;

wherein the current generating circuit comprises a first branch and a second branch, and the first control voltage is used to control a conductive state of the first branch;

when the first branch is conductive, the second branch outputs a first target current as the first current;

when the first branch is partially conductive, the second branch outputs a second target current as the first current;

when the first branch is turned off, the second branch outputs a third target current as the first current; and the third target current is greater than the second target current, and the second target current is greater than the first target current.

2. The power amplifier according to claim 1, wherein the first bias current is positively correlated with the first control voltage.

3. A control method applied to the power amplifier according to claim 1, comprising:

outputting the first current according to the received first control voltage by the current generating circuit;

performing current mirroring according to the first current and outputting the first bias current by the first mirroring circuit, wherein the first bias current is used to be input into the power amplifying circuit; and outputting the second radio frequency signal with the power that meets the preset condition according to the first radio frequency signal and the first bias current by the power amplifying circuit.

4. The power amplifier according to claim 1, wherein the first branch is conductive when the first control voltage is less than a first preset value, the first branch is turned off when the first control voltage is greater than a second preset value, and the first branch is partially conductive when the first control voltage is between the first preset value and the second preset value.

5. The power amplifier according to claim 1, wherein the current generating circuit further comprises a first current source; and an output end of the first current source is connected to the first branch and the second branch.

6. The power amplifier according to claim 5, wherein the second branch comprises a second current source, when the first branch is conductive, the first current is equal to a current of the second current source; and when the first branch is turned off, the first current is equal to a sum of currents of the first current source and the second current source.

7. The power amplifier according to claim 1, wherein the first branch comprise a fifth transistor, a seventh transistor and a first resistor;

a first end of the first resistor is used to connect with the first current source; a second end of the first resistor is connected to a source of the seventh transistor; a drain of the seventh transistor is connected to a drain of the fifth transistor and a gate of the fifth transistor; and a gate of the seventh transistor is used for receiving the first control voltage.

8. The power amplifier according to claim 1, wherein the second branch comprises a sixth transistor, an eighth transistor, a second resistor and a second current source;

a first end of the second resistor is used to connect with a first current source; a second end of the second resistor is connected to a source of the eighth transistor; a drain of the eighth transistor is connected to a drain of the sixth transistor, a gate of the sixth transistor and an output end of the second current source; and the second current source provides a minimum operating current of the power amplifier.

9. The power amplifier according to claim 8, wherein a gate of the eighth transistor is used to obtain a second control voltage to change a change rate of the first current.

10. The power amplifier according to claim 1, wherein the first mirroring circuit comprises a first transistor connected to the second branch; and the first transistor is used to, according to the first current output by the second branch, mirror the current, and output the first bias current.

11. A power amplifier, comprising: a current generating circuit, a first mirroring circuit and a power amplifying circuit, wherein the current generating circuit is configured to output a first current according to a received first control voltage;

the first mirroring circuit is configured to, according to the first current, mirror the current, and output a first bias current; and the power amplifying circuit has a stacked circuit unit, and is configured to output a second radio frequency signal with a power that meets a preset condition, according to a first radio frequency signal and the first bias current which are respectively input into different stacked transistors;

wherein the power amplifying circuit further comprises: a first input unit, a second input unit and a second mirroring circuit;

the first input unit is configured to receive the first bias current and provide the first bias current for a first stacked transistor of the stacked circuit unit;

the second input unit is configured to receive the first radio frequency signal; and the second mirroring circuit is configured to, according to the bias current of the power amplifier, mirror the current, output a second bias current, and provide the second bias current for a second stacked transistor of the stacked circuit unit, wherein the bias current is generated based on the first control voltage.

12. The power amplifier according to claim 1, wherein the preset condition comprises:

the power amplifier meeting a preset forward isolation index.

13. A control method applied to a power amplifier comprising: a current generating circuit, a first mirroring circuit and a power amplifying circuit, wherein the current generating circuit is configured to output a first current according to a received first control voltage;

the first mirroring circuit is configured to, according to the first current, mirror the current, and output a first bias current; and the power amplifying circuit has a stacked circuit unit, and is configured to output a second radio frequency signal with a power that meets a preset condition, according to a first radio frequency signal and the first bias current which are respectively input into different stacked transistors;

the control method comprising:

outputting the first current according to the received first control voltage by the current generating circuit:

performing current mirroring according to the first current and outputting the first bias current by the first mirroring circuit, wherein the first bias current is used to be input into the power amplifying circuit; and outputting the second radio frequency signal with the power that meets the preset condition according to the first radio frequency signal and the first bias current by the power amplifying circuit;

wherein the current generating circuit comprises a first branch and a second branch; and outputting the first current according to the received first control voltage comprises:

outputting a first target current as the first current according to the first control voltage by the second branch, when the first branch is conductive;

outputting a second target current as the first current according to the first control voltage by the second branch, when the first branch is partially conductive; and outputting a third target current as the first current according to the first control voltage by the second branch, when the first branch is turned off, wherein, the third target current is greater than the second target current, and the second target current is greater than the first target current.

14. The control method according to claim 13, wherein the first mirroring circuit comprises: a first transistor connected to the second branch; and performing current mirroring according to the first current and outputting a first bias current by a first mirroring circuit comprises:

performing current mirroring according to the first current output by the second branch and outputting the first bias current by the first transistor.

15. The control method according to claim 14, wherein the power amplifying circuit comprises: a first input unit, a second input unit, a second mirroring circuit and a stacked circuit unit; and outputting a second radio frequency signal with a power that meets a preset condition according to a first radio frequency signal and the first bias current by the power amplifying circuit comprises:

receiving the first bias current by the first input unit;

receiving the first radio frequency signal by the second input unit;

performing current mirroring according to the bias current of the power amplifying circuit and outputting a second bias current by the second mirroring circuit, wherein the second bias current is a current flowing through the stacked circuit unit; and outputting the second radio frequency signal with a power that meets a preset condition according to the first radio frequency signal, the second bias current and the first bias current by the stacked circuit unit.

16. The control method according to claim 3, wherein the preset condition comprises:

the power amplifier meeting a preset forward isolation index.

* * * * *